United States Patent
Blumel et al.

(10) Patent No.: US 12,223,392 B2
(45) Date of Patent: Feb. 11, 2025

(54) AMPLITUDE MODULATED PULSES FOR IMPLEMENTATION OF ENTANGLING GATES IN ION TRAP QUANTUM COMPUTERS

(71) Applicant: IONQ, INC., College Park, MD (US)

(72) Inventors: Reinhold Blumel, Middletown, CT (US); Nikodem Grzesiak, College Park, MD (US)

(73) Assignee: IONQ, INC., College Park, MD (US)

( * ) Notice: Subject to any disclaimer, the term of this patent is extended or adjusted under 35 U.S.C. 154(b) by 555 days.

(21) Appl. No.: 17/681,504

(22) Filed: Feb. 25, 2022

(65) Prior Publication Data

US 2022/0405627 A1 Dec. 22, 2022

Related U.S. Application Data

(60) Provisional application No. 63/155,175, filed on Mar. 1, 2021.

(51) Int. Cl.
| | | |
|---|---|---|
| *G06N 10/40* | (2022.01) | |
| *G06F 30/20* | (2020.01) | |
| *G06F 30/30* | (2020.01) | |
| *G06N 10/20* | (2022.01) | |

(52) U.S. Cl.
CPC ............ *G06N 10/40* (2022.01); *G06N 10/20* (2022.01); *G06F 30/20* (2020.01); *G06F 30/30* (2020.01)

(58) Field of Classification Search
CPC ........ G06N 10/40; G06N 10/20; G06F 30/20; G06F 30/30
USPC ............................................ 716/100; 703/14
See application file for complete search history.

(56) References Cited

U.S. PATENT DOCUMENTS

| | | | | |
|---|---|---|---|---|
| 2019/0378025 | A1* | 12/2019 | Corcoles-Gonzalez | G06N 20/10 |
| 2020/0369517 | A1* | 11/2020 | Nam | G06N 10/00 |
| 2020/0372389 | A1* | 11/2020 | Nam | H01S 3/09 |
| 2020/0372391 | A1* | 11/2020 | Nam | H01S 3/09 |
| 2020/0372392 | A1* | 11/2020 | Nam | G21K 1/003 |
| 2021/0174235 | A1* | 6/2021 | Kues | G06N 10/00 |
| 2022/0067565 | A1* | 3/2022 | Blumel | G06N 10/00 |
| 2022/0101166 | A1* | 3/2022 | Blumel | G06N 10/00 |

(Continued)

OTHER PUBLICATIONS

Grzesiak, N., Blumel, R., Wright, K. et al. Efficient arbitrary simultaneously entangling gates on a trapped-ion quantum computer. Nat Commun 11, 2963 (2020). https://doi.org/10.1038/s41467-020-16790-9.

(Continued)

*Primary Examiner* — Phallaka Kik
(74) *Attorney, Agent, or Firm* — Patterson + Sheridan, LLP

(57) ABSTRACT

A method of performing an entangling gate operation using a quantum computer system includes configuring, by a classical computer, an amplitude function of an amplitude-modulated laser pulse over a plurality of time segments to cause entangling interaction between a pair of trapped ions of a plurality of trapped ions, each of the plurality of trapped ions having two frequency-separated states defining a qubit, where the amplitude function in each time segment is splined using a set of basis functions and associated control parameters, and performing an entangling gate operation between the pair of trapped ions by applying, by a system controller, an amplitude-modulated laser pulse having the configured amplitude function to the pair of trapped ions.

21 Claims, 8 Drawing Sheets

(56) References Cited

U.S. PATENT DOCUMENTS

2022/0284334 A1* 9/2022 Nam .................. G06N 10/00
2022/0284335 A1* 9/2022 Nam .................. B82Y 10/00
2023/0029117 A1* 1/2023 Nam .................. G21K 1/003

OTHER PUBLICATIONS

Wright, K. Benchmarking an 11-qubit quantum computer. Nat. Commun. 10, 5464 (2019).
Molmer, K. & Sorensen, A. Multiparticle entanglement of hot trapped ions. Phys. Rev. Lett. 82, 1835-1838 (1999).
Sorensen, A. & Molmer, K. Quantum computation with ions in thermal motion. Phys. Rev. Lett. 82, 1971-1974 (1999).
Choi, T., Debnath, S., Manning, T. A., Figgatt, C., Gong, Z.-X., Duan, L.-M. & Monroe, C. Optimal quantum control of multimode couplings between trapped ion qubits for scalable entanglement. Phys. Rev. Lett. 112, 190502 (2014).
Zhu, S.-L., Monroe, C. & Duan, L.-M. Arbitrary-speed quantum gates within large ion crystals through minimum control of laser beams. Europhys. Lett. 73, 485-491 (2006).
Figgatt, C., Ostrander, A., Linke, N. M., Landsman, K. A. & Zhu, D. Parallel entangling operations on a universal ion trap quantum computer. University of Maryland, College Park, Maryland, National Science Foundation, Alexandria, VA, and IonQ Inc. , College Park, Maryland, Oct. 30, 2018.
Lu, Y., Zhang, S., Zhang, K., Chen, W. & Shen, Y. Scalable global entangling gates on arbitrary ion qubits. Nature 572, 363-367 (2019).
Beauregard, S. Circuit for Shor's algorithm using 2n+3 qubits. Quant. Inf. Comp. 3, 175-185 (2003).
Draper, T. G., Kutin, S. A., Rains, E. M. & Svore, K. M. A logarithmic-depth quantum carry-lookahead adder. Quant. Inf. Comp. 6, 351-369 (2006).
Maslov, D. & Nam, Y. Use of global interactions in efficient quantum circuit constructions. N. J. Phys. 20, 033018 (2018).
Bernstein, E. & Vazirani, U. Quantum complexity theory. Siam J. Comput. 26, 1411-1473 (1997).
Nam, Y. Ground-state energy estimation of the water molecule on a trapped ion quantum computer. npj Quant. Inf. 6, 33 (2020).
Van Dam, W., Hallgren, S. & Ip, L. Quantum algorithms for some hidden shift problems. SIAM J. Comput. 36, 763-778 (2006).
Blumel, R., Grzesiak, N. & Nam, Y. Power-optimal, stabilized entangling gate between trapped-ion qubits. Preprint at https://arxiv.org/abs/1905.09292 (2019).

* cited by examiner

AMPLITUDE MODULATED PULSES FOR IMPLEMENTATION OF ENTANGLING GATES IN ION TRAP QUANTUM COMPUTERS

CROSS-REFERENCE TO RELATED APPLICATIONS

This application claims benefit of U.S. provisional patent application Ser. No. 63/155,175, filed Mar. 1, 2021, which is herein incorporated by reference.

BACKGROUND

Field

The present disclosure generally relates to a method of generating an entangling gate in an ion trap quantum computer, and more specifically, to a method of constructing an amplitude-modulated laser pulse to generate the entangling gate using basis splines (B-splines) such that the amplitude-modulated pulse can be practically implemented.

Description of the Related Art

In quantum computing, quantum bits or qubits, which are analogous to bits representing a "0" and a "1" in a classical (digital) computer, are required to be prepared, manipulated, and measured (read-out) with near perfect control during a computation process. Imperfect control of the qubits leads to errors that can accumulate over the computation process, limiting the size of a quantum computer that can perform reliable computations.

Among physical systems upon which it is proposed to build large-scale quantum computers, is a chain of ions (e.g., charged atoms), which are trapped and suspended in vacuum by electromagnetic fields. The ions have internal hyperfine states which are separated by frequencies in the several GHz range and can be used as the computational states of a qubit (referred to as "qubit states"). These hyperfine states can be controlled using radiation provided from a laser, or sometimes referred to herein as the interaction with laser beams. The ions can be cooled to near their motional ground states using such laser interactions. The ions can also be optically pumped to one of the two hyperfine states with high accuracy (preparation of qubits), manipulated between the two hyperfine states (single-qubit gate operations) by laser beams, and their internal hyperfine states detected by fluorescence upon application of a resonant laser beam (read-out of qubits). A pair of ions can be controllably entangled (two-qubit gate operations) by qubit-state dependent force using an amplitude-modulated laser pulse that couples the ions to the collective motional modes of a chain of trapped ions, which arise from their Coulombic interaction between the ions.

However, there are practical limitations of controls of qubits that can be implemented in physical systems. For example, an amplitude of a laser pulse that varies too rapidly in time as compared to the limitation of real hardware, such as limited communication channel capacity and limited amplitude modulation rate, may not be implemented by a practical laser. Thus, there is a need for a procedure to accurately control qubits to perform a desired computation process within practical capabilities in physical systems.

SUMMARY

Embodiments of the present disclosure provide a method of performing an entangling gate operation using a quantum computer system. The method includes configuring, by a classical computer, an amplitude function of an amplitude-modulated laser pulse over a plurality of time segments to cause entangling interaction between a pair of trapped ions of a plurality of trapped ions, each of the plurality of trapped ions having two frequency-separated states defining a qubit, where the amplitude function in each time segment is splined using a set of basis functions and associated control parameters, and performing an entangling gate operation between the pair of trapped ions by applying, by a system controller, an amplitude-modulated laser pulse having the configured amplitude function to the pair of trapped ions.

Embodiments of the present disclosure also provide a non-volatile computer-readable medium including computer program instructions. The computer program instructions, when executed by a processor, cause the processor to configure an amplitude function of an amplitude-modulated laser pulse over a plurality of time segments to cause entangling interaction between a pair of trapped ions of a plurality of trapped ions, each of the plurality of trapped ions having two frequency-separated states defining a qubit, where the amplitude function in each time segment is splined using a set of basis functions and associated control parameters, and perform an entangling gate operation between the pair of trapped ions by applying an amplitude-modulated laser pulse having the configured amplitude function to the pair of trapped ions.

Embodiments of the present disclosure further provide a quantum computing system that includes a plurality of trapped ions, each of the trapped ions having two hyperfine states defining a qubit, and a classical computer including non-volatile memory having a number of instructions stored therein. The number of instructions, when executed by a processor, causes the quantum computing system to perform operations including configuring an amplitude function of an amplitude-modulated laser pulse over a plurality of time segments to cause entangling interaction between a pair of trapped ions of a plurality of trapped ions, each of the plurality of trapped ions having two frequency-separated states defining a qubit, where the amplitude function in each time segment is splined using a set of basis functions and associated control parameters, and performing an entangling gate operation between the pair of trapped ions by applying, by a system controller, an amplitude-modulated laser pulse having the configured amplitude function to the pair of trapped ions.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
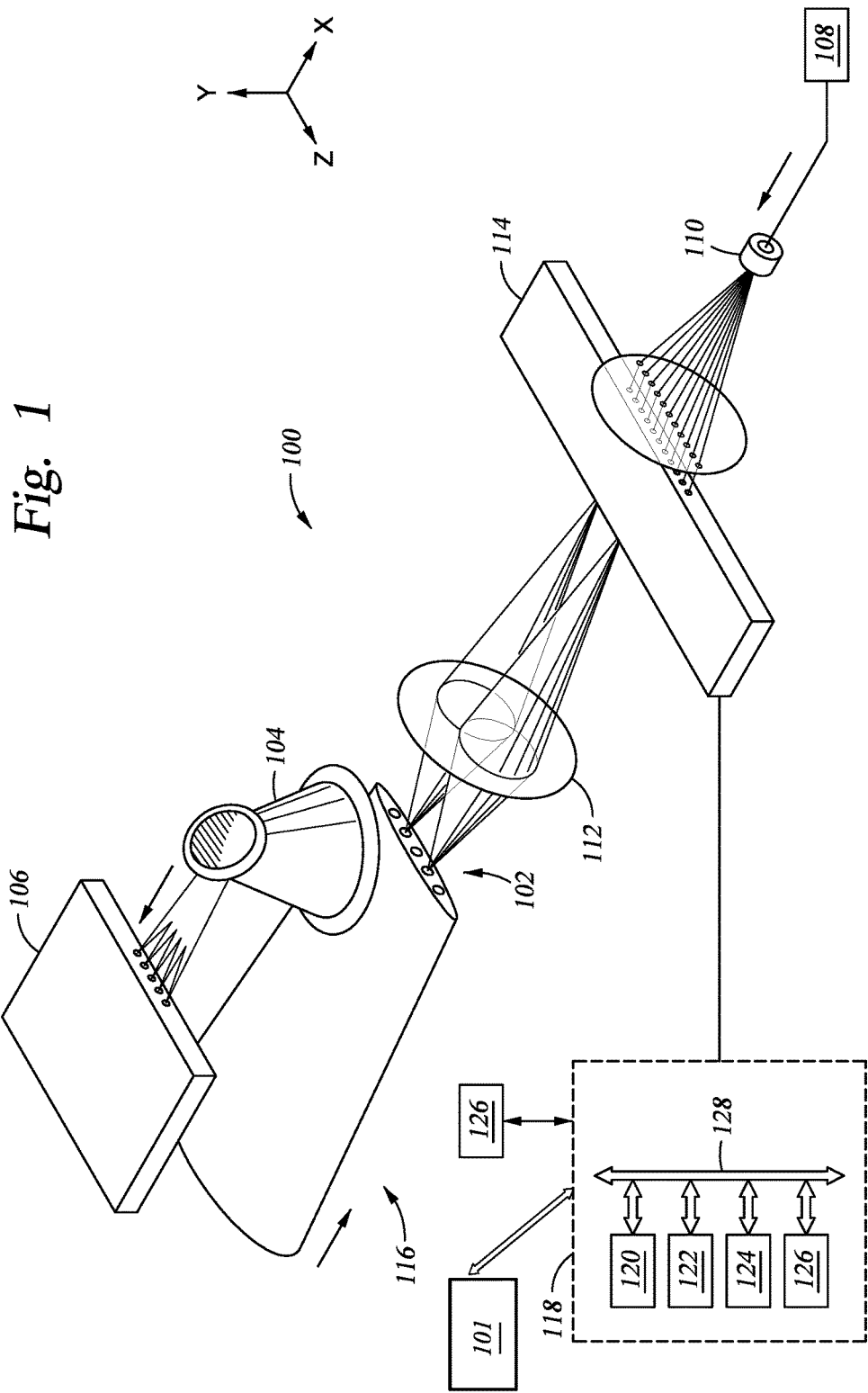
FIG. 1 is a partial view of an ion trap quantum computer according to one embodiment.

To facilitate understanding, identical reference numerals have been used, where possible, to designate identical elements that are common to the figures. In the figures and the following description, an orthogonal coordinate system including an X-axis, a Y-axis, and a Z-axis is used. The directions represented by the arrows in the drawing are assumed to be positive directions for convenience. It is contemplated that elements disclosed in some embodiments may be beneficially utilized on other implementations without specific recitation.

DETAILED DESCRIPTION

Embodiments described herein provide methods to configure an amplitude-modulated laser pulse to accurately control qubits and perform a desired computation process within a quantum computer within practical capabilities in a physical system that forms at least a part of the quantum computer. Specifically, due to speed and bandwidth limitations of practical hardware, for example, limited communication channel capacity and limited amplitude modulation rate, a laser pulse whose amplitude varies in time too rapidly may not be accurately implemented, and thus deviation of a laser pulse that is implemented from a desired amplitude-modulated laser pulse that is designed to perform an intended computation process cause infidelity in the computation process which can create errors in the computational result. The methods described herein include a method of configuring a laser pulse whose amplitude varies in time within the speed and bandwidth limitations of practical hardware used to form the quantum computing system. Therefore, by use of the methods provided herein, an amplitude-modulated laser pulse may be implemented in a quantum computing system, which includes a real physical system, accurately as designed, without causing infidelity in an intended computation process.

An overall quantum computing system that is able to perform quantum computations using trapped ions will include a classical computer, a system controller, and a quantum register. The classical computer performs supporting and system control tasks including selecting a quantum algorithm by use of a user interface, such as graphics processing unit (GPU), compiling the selected quantum algorithm into a series of universal logic gates including single-qubit gate operations and entangling gate operations, translating an entangling gate operation into an amplitude-modulated laser pulse to apply on the quantum register, and power-optimizing the amplitude-modulated laser pulse, by use of a central processing unit (CPU). A software program for performing the task of decomposing and executing the quantum algorithms is stored in a non-volatile memory within the classical computer. The quantum register includes trapped ions that are coupled with various hardware, including lasers to perform single-qubit gate operations and entangling gate operations by manipulating internal hyperfine states (qubit states) of the trapped ions and an acousto-optic modulator to read-out the internal hyperfine states (qubit states) of the trapped ions. The system controller receives from the classical computer the configuration of the power-optimized amplitude-modulated laser pulse at the beginning of running the selected algorithm on the quantum register, controls various hardware associated with controlling any and all aspects used to run the selected algorithm on the quantum register, and returns a read-out of the quantum register and thus output of results of the quantum computation(s) at the end of running the algorithm to the classical computer.

The methods and systems described herein include processes for configuring an amplitude-modulated laser pulse that are applied to a quantum register to perform an entangling gate operation, and also processes for power-optimizing the amplitude-modulated laser pulse that are applied to the quantum register and used to improve the performance of the quantum computer.

General Hardware Configurations

FIG. 1 is a partial view of an ion trap quantum computer, or system 100, according to one embodiment. The system 100 includes a classical (digital) computer 101, a system controller 118 and a quantum register that is a chain 102 of trapped ions (i.e., five shown) that extend along the Z-axis. Each ion in the chain 102 of trapped ions is an ion having a nuclear spin I and an electron spin S such that a difference between the nuclear spin I and the electron spin S is zero, such as a positive ytterbium ion, $^{171}\text{Yb}^+$, a positive barium ion $^{133}\text{Ba}^+$, a positive cadmium ion $^{111}\text{Cd}^+$ or $^{113}\text{Cd}^+$, which all have a nuclear spin I=½ and the $^2S_{1/2}$ hyperfine states. In some embodiments, all ions in the chain 102 of trapped ions are the same species and isotope (e.g., $^{171}\text{Yb}^+$). In some other embodiments, the chain 102 of trapped ions includes one or more species or isotopes (e.g., some ions are $^{171}\text{Yb}^+$ and some other ions are $^{133}\text{Ba}^+$). In yet additional embodiments, the chain 102 of trapped ions may include various isotopes of the same species (e.g., different isotopes of Yb, different isotopes of Ba). The ions in the chain 102 of trapped ions are individually addressed with separate laser beams.

The classical computer 101 includes a central processing unit (CPU), memory, and support circuits (or I/O). The memory is connected to the CPU, and may be one or more of a readily available memory, such as a read-only memory (ROM), a random access memory (RAM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like.

An imaging objective 104, such as an objective lens with a numerical aperture (NA), for example, of 0.37, collects fluorescence along the Y-axis from the ions and maps each ion onto a multi-channel photo-multiplier tube (PMT) 106 for measurement of individual ions. Non-copropagating Raman laser beams from a laser 108, which are provided along the X-axis, perform operations on the ions. A diffractive beam splitter 110 creates an array of static Raman beams 112 that are individually switched using a modulator that provides high-power slow modulation, such as a multi-channel acousto-optic modulator (AOM) 114, and is configured to modulate amplitudes and phases of pulses that selectively act on individual ions based on instructions provided from the classical computer 101 via field-programmable gate array (FPGA) (not shown). A global Raman laser beam 116 illuminates ions at once. In some embodiments, individual Raman laser beams 116 (not shown) each illuminate individual ions. The system controller (also referred to as a "RF controller") 118 controls the AOM 114. The system controller 118 includes a central processing unit (CPU) 120, a read-only memory (ROM) 122, a random access memory (RAM) 124, a storage unit 126, and the like. The CPU 120 is a processor of the RF controller 118. The ROM 122 stores various programs and the RAM 124 is the working memory for various programs and data. The storage unit 126 includes a nonvolatile memory, such as a hard disk drive (HDD) or a flash memory, and stores various programs even if power is turned off. The CPU 120, the ROM 122, the RAM 124, and the storage unit 126 are interconnected via a bus 128. The RF controller 118 executes a control program which is stored in the ROM 122 or the storage unit 126 and uses the RAM 124 as a working area. The control program will include one or more software applications that include program code (e.g., instructions) that may be executed by a processor in order to perform various functionalities associated with receiving and analyzing data and controlling any and all aspects of the methods and hardware used to create the ion trap quantum computer system 100 discussed herein.

The AOM 114 may have a characteristic response time that can be up to 0.25 microsecond. The instructions provided from the classical computer 101 are loaded onto onboard memory of the FPGA, converted to control signals for modulating amplitudes and phases of pulses, and transferred to the AOM 114. The transferred control signal(s) provide information that enables the AOM 114 to selectively deliver the amplitude- and phase-modulated pulses to each of the trapped ions in the chain 102. The FPGA may have a finite amount of onboard memory therein that limits resolution, for example, to about 0.128 MHz per microsecond in the amplitude modulation. Thus, the amplitude of a pulse may be modulated up to about 0.12 MHz per microsecond during a gate operation. Additionally, the FPGA has a finite clock cycle, which, for example, may be about 4 nanoseconds, to update the control signal passed to the AOM 114. These limitations of the system controller 118 will contribute to the speed and bandwidth limitation of practical hardware used to form the system 100. To account for these limitations in a real system, one or more embodiments of the one described herein can be used to accurately control qubits and perform a desired computation process within a quantum computer.

Figure 2:
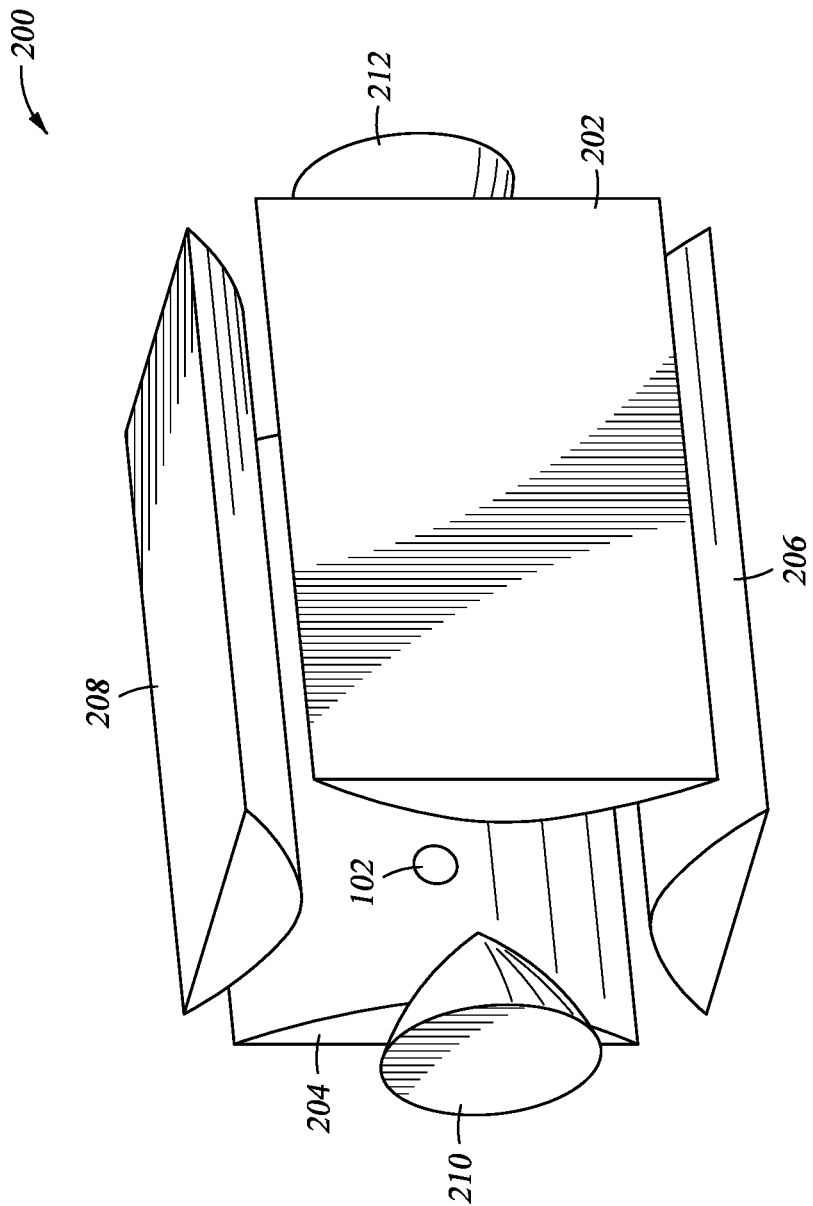
FIG. 2 depicts a schematic view of an ion trap for confining ions in a chain according to one embodiment.

FIG. 2 depicts a schematic view of an ion trap 200 (also referred to as a Paul trap) for confining ions in the chain 102 according to one embodiment. The confining potential is exerted by both static (DC) voltage and radio frequency (RF) voltages. A static (DC) voltage $V_S$ is applied to end-cap electrodes 210 and 212 to confine the ions along the Z-axis (also referred to as an "axial direction," "longitudinal direction," or "first direction"). The ions in the chain 102 are nearly evenly distributed in the axial direction due to the Coulomb interaction between the ions. In some embodiments, the ion trap 200 includes four hyperbolically-shaped electrodes 202, 204, 206, and 208 extending along the Z-axis.

During operation, a sinusoidal voltage $V_1$ (with an amplitude $V_{RF}/2$) is applied to an opposing pair of the electrodes 202, 204 and a sinusoidal voltage $V_2$ with a phase shift of 180° from the sinusoidal voltage $V_1$ (and the amplitude $V_{RF}/2$) is applied to the other opposing pair of the electrodes 206, 208 at a driving frequency $\omega_{RF}$, generating a quadrupole potential. In some embodiments, a sinusoidal voltage is only applied to one opposing pair of the electrodes 202, 204, and the other opposing pair 206, 208 is grounded. The quadrupole potential creates an effective confining force in the X-Y plane perpendicular to the Z-axis (also referred to as a "radial direction," "transverse direction," or "second direction") for each of the trapped ions, which is proportional to a distance from a saddle point (i.e., a position in the axial direction (Z-direction)) at which the RF electric field vanishes. The motion in the radial direction (i.e., direction in the X-Y plane) of each ion is approximated as a harmonic oscillation (referred to as secular motion) with a restoring force towards the saddle point in the radial direction and can be modeled by spring constants $k_x$ and $k_y$, respectively. In some embodiments, the spring constants in the radial direction are modeled as equal when the quadrupole potential is symmetric in the radial direction. However, undesirably in some cases, the motion of the ions in the radial direction may be distorted due to some asymmetry in the physical trap configuration, a small DC patch potential due to inhomogeneity of a surface of the electrodes, or the like and due to these and other external sources of distortion the ions may lie off-center from the saddle points.

Trapped Ion Configuration and Quantum Bit Information

Figure 3A:
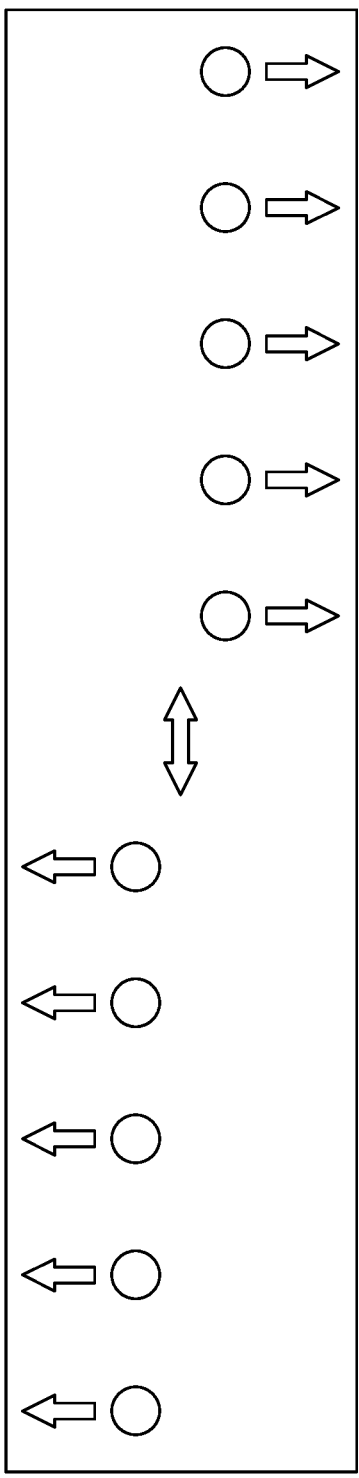
FIGS. 3A, 3B, and 3C depict a few schematic collective transverse motional mode structures of a chain of five trapped ions.
Figure 3B:
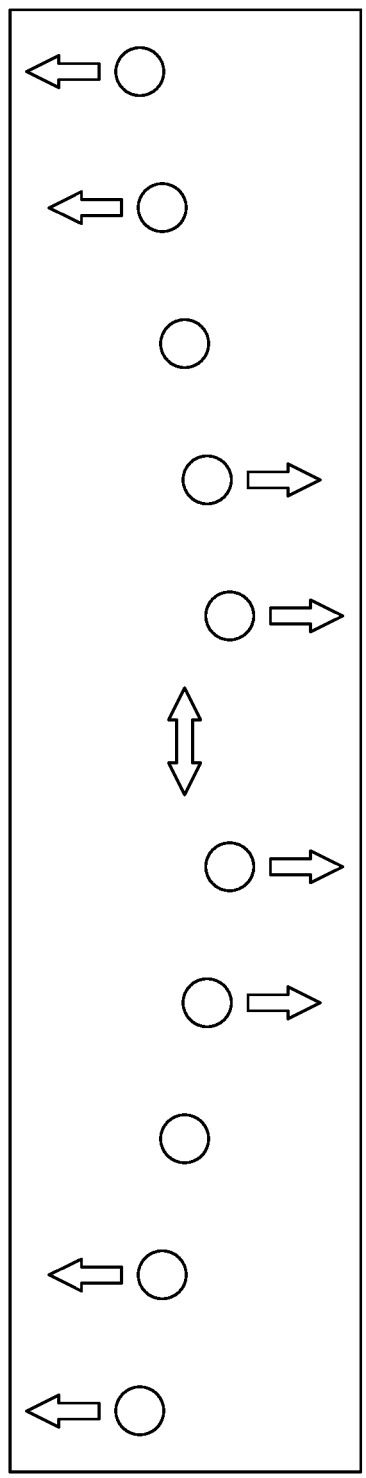
Figure 3C:
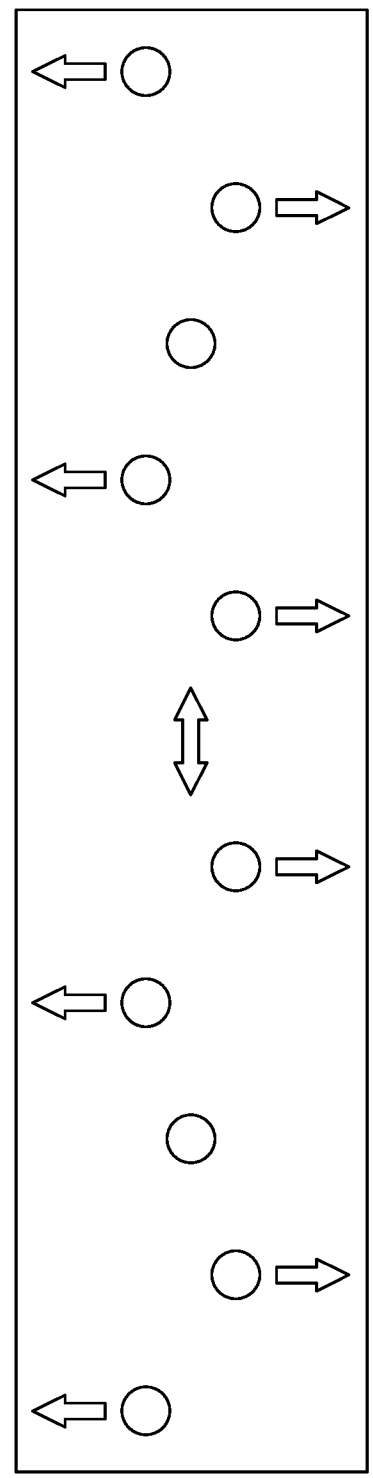

FIGS. 3A, 3B, and 3C depict a few schematic structures of collective transverse motional modes (also referred to simply as "motional mode structures") of a chain 102 of five trapped ions, for example. Here, the confining potential due to a static voltage $V_S$ applied to the end-cap electrodes 210 and 212 is weaker compared to the confining potential in the radial direction. The collective motional modes of the chain 102 of trapped ions in the transverse direction are determined by the Coulomb interaction between the trapped ions combined with the confining potentials generated by the ion trap 200. The trapped ions undergo collective transversal motions (referred to as "collective transverse motional modes," "collective motional modes," or simply "motional modes"), where each mode has a distinct energy (or equivalently, a frequency) associated with it. A motional mode having the p-th lowest energy is hereinafter referred to as $|n_{ph}\rangle_p$, where $n_{ph}$ denotes the number of motional quanta (in units of energy excitation, referred to as phonons) in the motional mode, and the number of motional modes P in a given transverse direction is equal to the number of trapped ions N in the chain 102. FIGS. 3A-3C schematically illustrate examples of different types of collective transverse motional modes that may be experienced by five trapped ions that are positioned in a chain 102. FIG. 3A is a schematic view of a common motional mode $|n_{ph}\rangle_P$ having the highest energy, where P is both the number of the mode and the total number of motional modes. In the common motional mode $|n\rangle_P$, all ions oscillate in phase in the transverse direction. FIG. 3B is a schematic view of a tilt motional mode $|n_{ph}\rangle_{P-1}$ which has the second highest energy. In the tilt motional mode, ions on opposite ends move out of phase in the transverse direction (i.e., in opposite directions). FIG. 3C is a schematic view of a higher-order motional mode $|n_{ph}\rangle_{P-3}$ which has a lower energy than that of the tilt motional mode $|n_{ph}\rangle_{P-1}$, and in which the ions move in a more complicated mode pattern.

It should be noted that the particular configuration described above is just one among several possible examples of a trap for confining ions according to the present disclosure and does not limit the possible configurations, specifications, or the like of traps according to the present disclosure. For example, the geometry of the electrodes is not limited to the hyperbolic electrodes described above. In other examples, a trap that generates an effective electric field causing the motion of the ions in the radial direction as harmonic oscillations may be a multi-layer trap in which several electrode layers are stacked and an RF voltage is applied to two diagonally opposite electrodes, or a surface trap in which all electrodes are located in a single plane on a chip. Furthermore, a trap may be divided into multiple segments, adjacent pairs of which may be linked by shuttling one or more ions, or coupled by photon interconnects. A trap may also be an array of individual trapping regions arranged closely to each other on a micro-fabricated ion trap chip. In some embodiments, the quadrupole potential has a spatially varying DC component in addition to the RF component described above.

Figure 4:
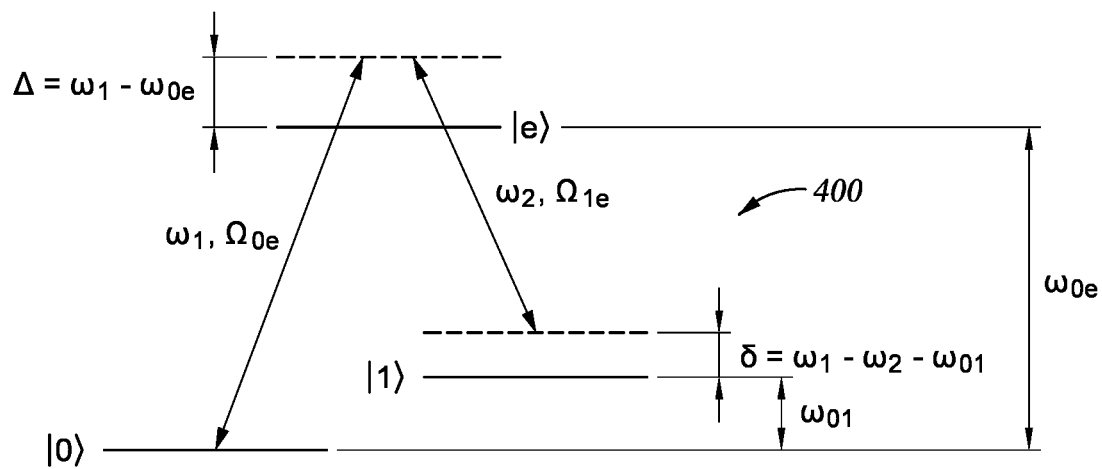
FIG. 4 depicts a schematic energy diagram of each ion in a chain of trapped ions according to one embodiment.

FIG. 4 depicts a schematic energy diagram 400 of each ion in the chain 102 of trapped ions according to one embodiment. Each ion in the chain 102 of trapped ions is an ion having a nuclear spin I and an electron spin S such that a difference between the nuclear spin I and the electron spin S is zero. In one example, each ion may be a positive ytterbium ion, $^{171}Yb^+$ which has a nuclear spin I=½ and the $^2S_{1/2}$ hyperfine states (i.e., two electronic states) with an energy split corresponding to a frequency difference (referred to as a "carrier frequency") of $\omega_{01}/2\pi$=12.642812 GHz. In other examples, each ion may be a positive barium ion $^{133}Ba^+$, a positive cadmium ion $^{111}Cd^+$ or $^{113}Cd^+$, which all have a nuclear spin I=½ and the $^2S_{1/2}$ hyperfine states. A qubit is formed with the two hyperfine states, denoted as $|0\rangle$ and $|1\rangle$, where the hyperfine ground state (i.e., the lower energy state of the $^2S_{1/2}$ hyperfine states) is chosen to represent $|0\rangle$. Hereinafter, the terms "hyperfine states," "internal hyperfine states," and "qubits" may be interchangeably used to represent $|0\rangle$ and $|1\rangle$. Each ion may be cooled (i.e., kinetic energy of the ion may be reduced) to near the motional ground state $|0\rangle_p$ for any motional mode p with no phonon excitation (i.e., $n_{ph}$=0) by known laser cooling methods, such as Doppler cooling or resolved sideband cooling, and then the qubit state prepared in the hyperfine ground state $|0\rangle$ by optical pumping. Here, $|0\rangle$ represents the individual qubit state of a trapped ion whereas $|0\rangle_p$ with the subscript p denotes the motional ground state for a motional mode p of a chain 102 of trapped ions.

An individual qubit state of each trapped ion may be manipulated by, for example, a mode-locked laser at 355 nanometers (nm) via the excited $^2P_{1/2}$ level (denoted as $|e\rangle$). As shown in FIG. 4, a laser beam from the laser may be split into a pair of non-copropagating laser beams (a first laser beam with frequency $\omega_1$ and a second laser beam with frequency $\omega_2$) in the Raman configuration, and detuned by a one-photon transition detuning frequency $\Delta = \omega_1 - \omega_{0e}$ with respect to the transition frequency $\omega_{0e}$ between $|0\rangle$ and $|e\rangle$, as illustrated in FIG. 4. A two-photon transition detuning frequency $\delta$ includes adjusting the amount of energy that is provided to the trapped ion by the first and second laser beams, which when combined is used to cause the trapped ion to transfer between the hyperfine states $|0\rangle$ and $|1\rangle$. When the one-photon transition detuning frequency $\Delta$ is much larger than a two-photon transition detuning frequency (also referred to simply as "detuning frequency") $\delta = \omega_1 - \omega_2 - \omega_{01}$ (hereinafter denoted as $\pm\mu$, $\mu$ being a positive value), single-photon Rabi frequencies $\Omega_{0e}(t)$ and $\Omega_{1e}(t)$ (which are time-dependent, and are determined by amplitudes and phases of the first and second laser beams), at which Rabi flopping between states $|0\rangle$ and $|e\rangle$ and between states $|1\rangle$ and $|e\rangle$ respectively occur, and a spontaneous emission rate from the excited state $|e\rangle$, Rabi flopping between the two hyperfine states $|0\rangle$ and $|1\rangle$ (referred to as a "carrier transition") is induced at the two-photon Rabi frequency $\Omega(t)$. The two-photon Rabi frequency $\Omega(t)$ has an intensity (i.e., absolute value of amplitude) that is proportional to $\Omega_{0e}\Omega_{1e}/2\Delta$, where $\Omega_{0e}$ and $\Omega_{1e}$ are the single-photon Rabi frequencies due to the first and second laser beams, respectively. Hereinafter, this set of non-copropagating laser beams in the Raman configuration to manipulate internal hyperfine states of qubits (qubit states) may be referred to as a "composite pulse" or simply as a "pulse," and the resulting time-dependent pattern of the two-photon Rabi frequency $\Omega(t)$ may be referred to as an "amplitude" of a pulse or simply as a "pulse," which are illustrated and further described below. The detuning frequency $\delta = \omega_1 - \omega_2 - \omega_{01}$ may be referred to as detuning frequency of the composite pulse or detuning frequency of the pulse. The amplitude of the two-photon Rabi frequency $\Omega(t)$, which is determined by amplitudes of the first and second laser beams, may be referred to as an "amplitude" of the composite pulse.

It should be noted that the particular atomic species used in the discussion provided herein is just one example of atomic species which have stable and well-defined two-level energy structures when ionized and an excited state that is optically accessible, and thus is not intended to limit the possible configurations, specifications, or the like of an ion trap quantum computer according to the present disclosure. For example, other ion species include alkaline earth metal ions (Be$^+$, Ca$^+$, Sr$^+$, Mg+, and Ba$^+$) or transition metal ions (Zn$^+$, Hg$^+$, Cd$^+$).

Figure 5:
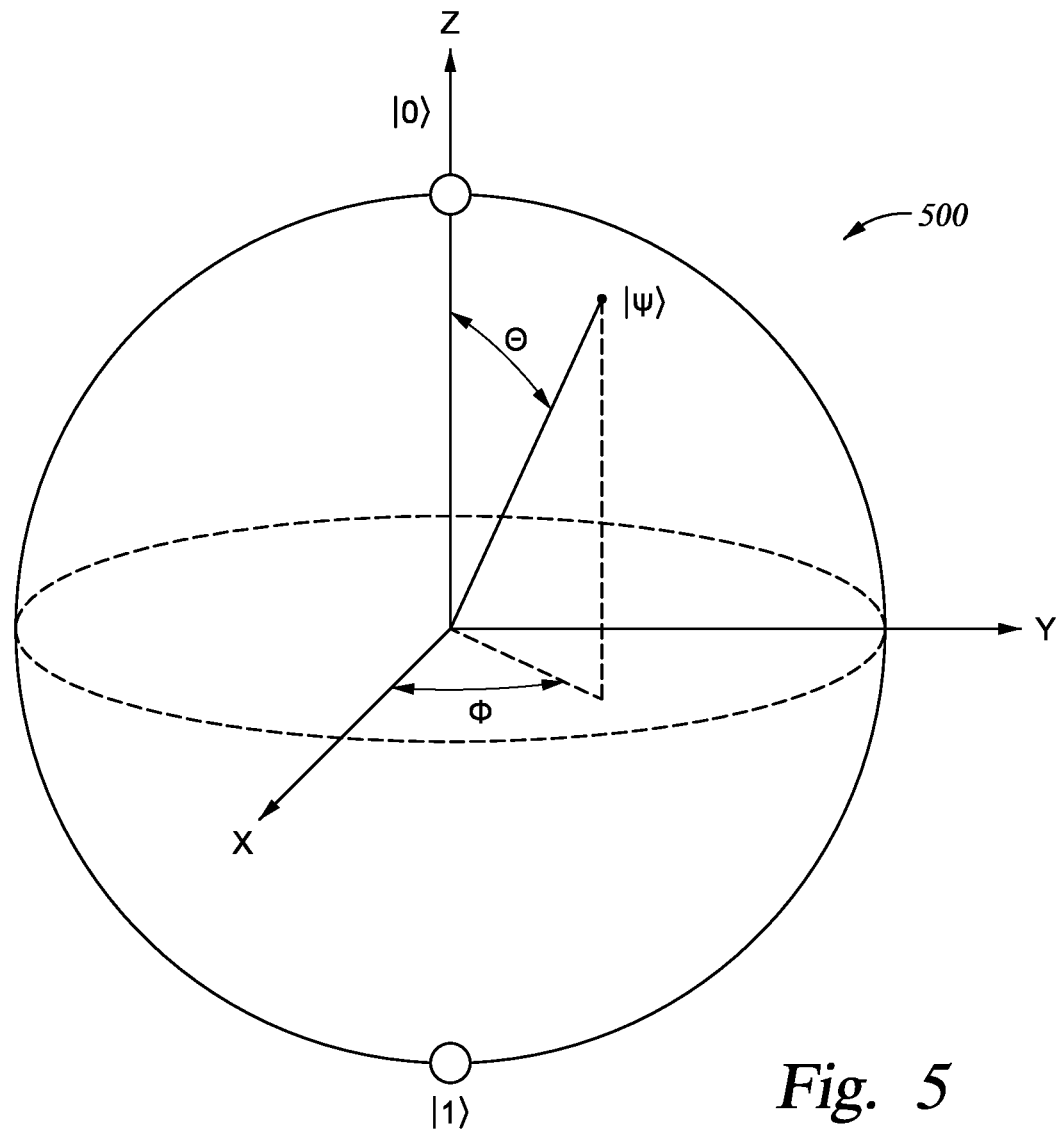
FIG. 5 depicts a qubit state of an ion represented as a point on a surface of the Bloch sphere.

FIG. 5 is provided to help visualize a qubit state of an ion, represented as a point on the surface of the Bloch sphere 500 with an azimuthal angle ϕ and a polar angle θ. Application of the composite pulse as described above, causes Rabi flopping between the qubit state $|0\rangle$ (represented as the north pole of the Bloch sphere) and $|1\rangle$ (the south pole of the Bloch sphere) to occur. Adjusting time duration and amplitudes of the composite pulse flips the qubit state from $|0\rangle$ to $|1\rangle$ (i.e., from the north pole to the south pole of the Bloch sphere), or the qubit state from $|1\rangle$ to $|0\rangle$ (i.e., from the south pole to the north pole of the Bloch sphere). This application of the composite pulse is referred to as a "π-pulse". Further, by adjusting time duration and amplitudes of the composite pulse, the qubit state $|0\rangle$ may be transformed to a superposition state $|0\rangle+|1\rangle$, where the two qubit states $|0\rangle$ and $|1\rangle$ are added and equally-weighted in-phase (a normalization factor of the superposition state is omitted hereinafter for convenience) and the qubit state $|1\rangle$ to a superposition state $|0\rangle-|1\rangle$, where the two qubit states $|0\rangle$ and $|1\rangle$ are added equally-weighted but out of phase. This application of the composite pulse is referred to as a "π/2-pulse". More generally, a superposition of the two qubits states $|0\rangle$ and $|1\rangle$ that are added and equally-weighted is represented by a point that lies on the equator of the Bloch sphere. For example, the superposition states $|0\rangle \pm |1\rangle$ correspond to points on the equator with the azimuthal angle φ being zero and π, respectively. The superposition states that correspond to points on the equator with the azimuthal angle φ are denoted as $|0\rangle + e^{i\phi}|1\rangle$ (e.g., $|0\rangle \pm i|1\rangle$ for $\phi = \pm\pi/2$). Transformation between two points on the equator (i.e., a rotation about the Z-axis on the Bloch sphere) can be implemented by shifting phases of the composite pulse.

Figure 6A:
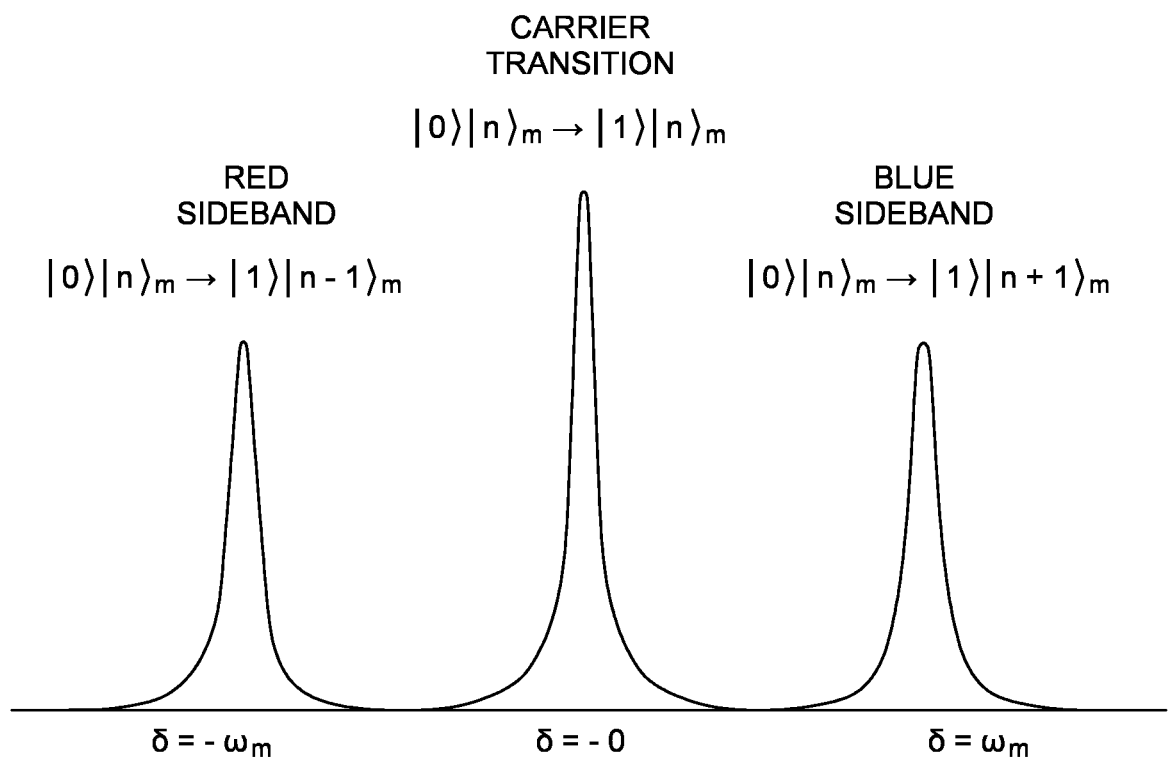
FIGS. 6A and 6B depict schematic views of the motional sideband spectrum of each ion and a motional mode according to one embodiment.
Figure 6B:
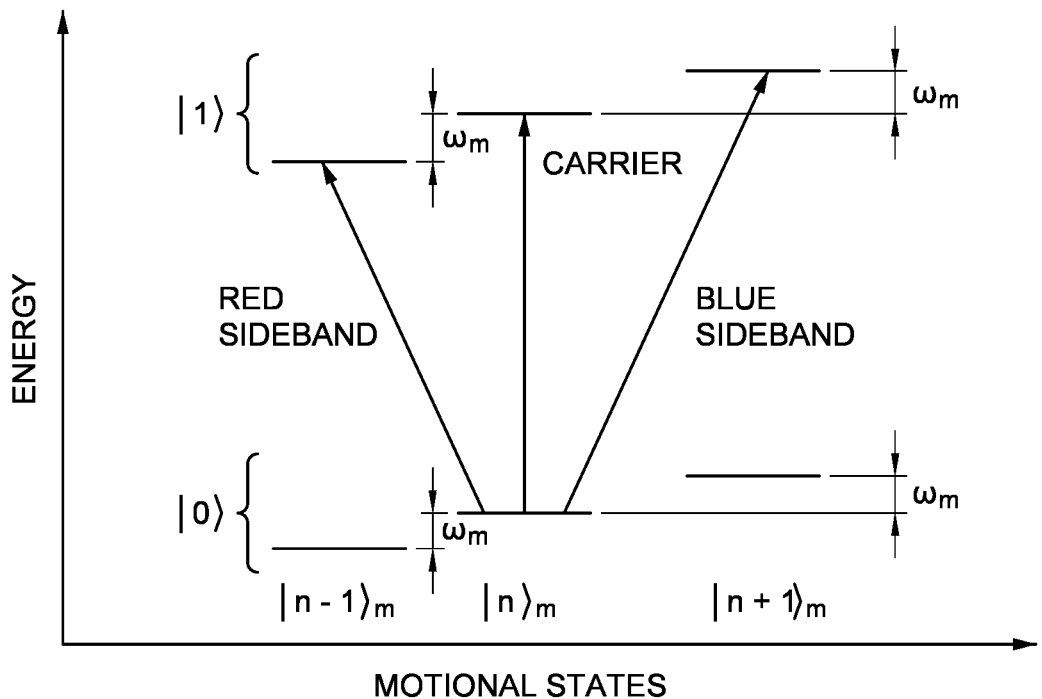

In an ion trap quantum computer, the motional modes may act as a data bus to mediate entanglement between two qubits and this entanglement is used to perform an XX gate operation (also referred to as an "entangling gate"). That is, each of the two qubits is entangled with the motional modes, and then the entanglement is transferred to an entanglement between the two qubits by using motional sideband excitations, as described below. FIGS. 6A and 6B schematically depict views of a motional sideband spectrum for an ion in the chain 102 in a motional mode $|n_{ph}\rangle_p$ having frequency $\omega_p$ according to one embodiment. As illustrated in FIG. 6B, when the detuning frequency of the composite pulse is zero (i.e., a frequency difference between the first and second laser beams is tuned to the carrier frequency, $\Delta = \omega_1 - \omega_2 - \omega_{01} = 0$) simple Rabi flopping between the qubit states $|0\rangle$ and $|1\rangle$ (carrier transition) occurs. When the detuning frequency of the composite pulse is positive (i.e., the frequency difference between the first and second laser beams is tuned higher than the carrier frequency, $\delta = \omega_1 - \omega_2 \omega_{01} = \mu 2 0$, referred to as a blue sideband), Rabi flopping between combined qubit-motional states $|0\rangle|n_{ph}\rangle_p$ and $|1\rangle|n_{ph}+1\rangle_p$ occurs (i.e., a transition from the p-th motional mode with n-phonon excitations denoted by $|n_{ph}\rangle_p$ to the p-th motional mode with $(n_{ph}+1)$-phonon excitations denoted by $|n_{ph}+1\rangle_p$ occurs when the qubit state $|0\rangle$ flips to $|1\rangle$). When the detuning frequency of the composite pulse is negative (i.e., the frequency difference between the first and second laser beams is tuned lower than the carrier frequency by the frequency $\omega_p$ of the motional mode $|n_{ph}\rangle_p$, $\delta = \omega_1 - \omega_2 - \omega_{01} = -\mu < 0$, referred to as a red sideband), Rabi flopping between combined qubit-motional states $|0\rangle|n_{ph}\rangle_p$ and $|1\rangle|n_{ph}-1\rangle$ occurs (i.e., a transition from the motional mode $|n_{ph}\rangle_p$ to the motional mode $|n_{ph}-1\rangle_p$ with one less phonon excitations occurs when the qubit state $|0\rangle$ flips to $|1\rangle$). A π/2-pulse on the blue sideband applied to a qubit transforms the combined qubit-motional state $|0\rangle|n_{ph}\rangle_p$ into a superposition of $|0\rangle|n_{ph}\rangle_p$ and $|1\rangle|n_{ph}+1\rangle_p$. A π/2-pulse on the red sideband applied to a qubit transforms the combined qubit-motional $|0\rangle|n_{ph}\rangle_p$ into a superposition of $|0\rangle n_{ph}\rangle_p$ and $|1\rangle|n_{ph}-1\rangle_p$. When the two-photon Rabi frequency $\Omega(t)$ is smaller as compared to the detuning frequency $\delta = \omega_1 - \omega_2 - \omega_{01} = \pm\mu$ the blue sideband transition or the red sideband transition may be selectively driven. Thus, a qubit can be entangled with a desired motional mode by applying the right type of pulse, such as a π/2-pulse, which can be subsequently entangled with another qubit, leading to an entanglement between the two qubits. Entanglement between qubits is needed to perform an XX-gate operation in an ion trap quantum computer.

By controlling and/or directing transformations of the combined qubit-motional states as described above, an XX-gate operation may be performed on two qubits (i-th and j-th qubits). In general, the XX-gate operation (with maximal entanglement) respectively transforms two-qubit states $|0\rangle_i|0\rangle_j$, $|0\rangle_i|1\rangle_j$, $|1\rangle_i|0\rangle_j$, and $|1\rangle_i|1\rangle_j$ as follows:

$|0\rangle_i|0\rangle_j \rightarrow |0\rangle_i|0\rangle_j - i|1\rangle_i|1\rangle_j$ $|0\rangle_i|1\rangle_j \rightarrow |0\rangle_i|1\rangle_j - i|1\rangle_i|0\rangle_j$ $|1\rangle_i|0\rangle_j \rightarrow -i|0\rangle_i|1\rangle_j + |1\rangle_i|0\rangle_j$ $|1\rangle_i|1\rangle_j \rightarrow -i|0\rangle_i|0\rangle_j + |1\rangle_i|1\rangle_j$ For example, when the two qubits (i-th and j-th qubits) are both initially in the hyperfine ground state $|0\rangle$ (denoted as $|0\rangle_i|0\rangle_j$) and subsequently a π/2-pulse on the blue sideband is applied to the i-th qubit, the combined state of the i-th qubit and the motional mode $|0\rangle_i|n_{ph}\rangle_p$ is transformed into a superposition of $|0\rangle_i|n_{ph}\rangle_p$ and $|1\rangle_i|n_{ph}+1\rangle_p$, and thus the combined state of the two qubits and the motional mode is transformed into a superposition of $|0\rangle_i|0\rangle_j|n_{ph}\rangle_p$ and $|1\rangle_i|0\rangle_j|n_{ph}+1\rangle_p$. When a π/2-pulse on the red sideband is applied to the j-th qubit, the combined state of the j-th qubit and the motional mode $|0\rangle_j|n_{ph}\rangle_p$ is transformed to a superposition of $|0\rangle_j|n_{ph}\rangle_p$ and $|1\rangle_j|n_{ph}-1\rangle_p$ and the combined state $|0\rangle_j|n_{ph}+1\rangle_p$ is transformed into a superposition of $|0\rangle_j|n_{ph}+1\rangle_p$ and $|1\rangle_j|n_{ph}\rangle_p$.

Thus, applications of a π/2-pulse on the blue sideband on the i-th qubit and a π/2-pulse on the red sideband on the j-th qubit may transform the combined state of the two qubits and the motional mode $|0\rangle_i|0\rangle_j|n_{ph}\rangle_p$ into a superposition of 51 $0\rangle_i|0\rangle_j|n_{ph}\rangle_p$ and $|1\rangle_i|1\rangle_j|n_{ph}\rangle_p$, the two qubits now being in an entangled state. For those of ordinary skill in the art, it should be clear that two-qubit states that are entangled with a motional mode having a different number of phonon excitations from the initial number of phonon excitations $n_{ph}$ (i.e., $|1\rangle_i|0\rangle_j n_{ph}+1\rangle_p$ and $|0\rangle_i|1\rangle_j|n_{ph}-1\rangle_p$) can be removed by a sufficiently complex pulse sequence, and thus the combined state of the two qubits and the motional mode after the XX-gate operation may be considered disentangled as the initial number of phonon excitations $n_{ph}$ in the p-th motional mode stays unchanged at the end of the XX-gate operation. Thus, qubit states before and after the XX-gate operation will be described below generally without including the motional modes.

More generally, the combined state of i-th and j-th qubits transformed by the application of the composite pulse on the sidebands for duration τ (referred to as a "gate duration"), having an amplitude function $\Omega(t)$ and a detuning frequency μ, can be described in terms of an entangling interaction $\chi_{i,j}(\tau)$ as follows:

$|0\rangle_i|0\rangle_j \rightarrow \cos(2\chi_{i,j}(\tau))|0\rangle_i|0\rangle_j - i\sin(2\chi_{i,j}(\tau))|1\rangle_i|1\rangle_j$ $|0\rangle_i|1\rangle_j \rightarrow \cos(2\chi_{i,j}(\tau))|0\rangle_i|1\rangle_j - i\sin(2\chi_{i,j}(\tau))|1\rangle_i|0\rangle_j$ $|1\rangle_i|0\rangle_j \rightarrow -i\sin(2\chi_{i,j}(\tau))|0\rangle_i|1\rangle_j + \cos(2\chi_{i,j}(\tau))|1\rangle_i|0\rangle_j$ $|1\rangle_i|1\rangle_j \rightarrow -i\sin(2\chi_{i,j}(\tau))|0\rangle_i|0\rangle_j + \cos(2\chi_{i,j}(\tau))|1\rangle_i|1\rangle_j$ where,
$X_{i,j}(\tau)=\Sigma_{p=1}^{P}\eta_{i,p}\eta_{j,p}\int_0^\tau dt\int_0^{t'}dt'\Omega(t)\Omega(t')$ $\sin(\mu t)\sin(\mu t')\sin[\omega_p(t'-t)]$, $\eta_{i,p}$ is the Lamb-Dicke parameter that quantifies the coupling strength between the i-th ion and the p-th motional mode having the frequency $\omega_p$, and P is the number of the motional modes (equal to the number N of ions in the chain 102).

Configuration of Amplitude-Modulated Laser Pulse for Entangling Gate Operations

The entanglement between two qubits (trapped ions) described above can be used to perform an XX-gate operation. The XX-gate operation (XX gate) along with single-qubit operation (R gate) forms a set of universal gates {R, XX} that can be used to build a quantum computer to perform desired computational processes. In configuring an amplitude-modulated laser pulse to deliver to two trapped ions (e.g., i-th and j-th trapped ions) in the chain 102 of trapped ions for a gate duration τ for performing an XX-gate operation between the two trapped ions, an amplitude function $\Omega(t)$ of the amplitude-modulated laser pulse is adjusted as a control parameter to ensure the amplitude-modulated laser pulse performs the intended XX-gate operation, by imposing the following conditions. First, all trapped ions in the chain 102 that are displaced from their initial positions as the motional modes are excited by the delivery of the amplitude-modulated laser pulse must return to the initial positions at the end of the XX-gate operation. This first condition is referred to as a phase-space condition, as described below in detail. Second, the XX-gate operation must be robust and stabilized against fluctuations in frequencies of the motional modes. This second condition is referred to as a stabilization condition. Third, entangling interaction $X_{i,j}(\tau)$ generated between i-th and j-th trapped ions by the amplitude-modulated laser pulse must have a desired value $\theta_{i,j}$ ($0<\theta_{i,j}\leq\pi/8$). This third condition is referred to as an entangling angle condition. Fourth, required laser power to implement the amplitude-modulated laser pulse may be minimized. This fourth condition is referred to as a power-optimal condition.

In adjusting the amplitude function $\Omega(t)$, the gate duration τ is divided into $N_{seg}$ time segments ($t\in[(n-1)\Delta t, n\Delta t]$, $n=1,\ldots,N_{seg}$), each having a time interval $\Delta t$ ($=\tau/N_{seg}$), and the amplitude function $\Omega(t)$ in each time segment is splined such that the adjusted amplitude function $\Omega(t)$ can be directly implemented by real speed- and bandwidth-limited hardware, such as illustrated in the system 100 (FIG. 1). In some embodiments, a basis spline (referred to as a "B-spline" or "spline wavelets") that is known in the art is used for splining the amplitude function $\Omega(t)$ in each time segment. A B-spline of order r is a piecewise polynomial function of degree r−1. For example, the basis functions $\varphi_n^1(t)$ of the B-spline of order 1 (referred to also as "constant wavelets") is defined as $$\varphi_n^1(t):=\begin{cases} 1, & (n-1)\Delta t \leq t < n\Delta t \\ 0, & \text{otherwise} \end{cases}.$$

The basis functions $\varphi_n^r(t)$ of the B-spline of order r (>1) are defined recursively by $$\varphi_n^r(t):=\omega_n^{r-1}(t)\varphi_n^{r-1}(t)+[1-\omega_{n+1}^{r-1}(t)]\varphi_{n+1}^{r-1}(t),$$

where $$\omega_n^{r-1}(t):=\begin{cases} \dfrac{t-(n-1)\Delta t}{(r-1)\Delta t}, & (n-1)\Delta t \leq t < n\Delta t \\ 0, & \text{otherwise} \end{cases}.$$

The basis functions $\varphi_n^2(t)$ of the B-spline of order 2 (referred to also as "linear wavelets") are thus $$\varphi_n^2(t):=\begin{cases} \dfrac{1}{\Delta t}[t-(n-1)\Delta t], & \text{if } (n-1)\Delta t \leq t < n\Delta t \\ \dfrac{1}{\Delta t}[(n+1)\Delta t - t], & \text{if } n\Delta t \leq t < (n+1)\Delta t \\ 0 & \text{otherwise} \end{cases}.$$

A set of basis functions $\varphi_n^r(t)$ of a B-spline of order r is complete (i.e., any splined curve of order r or lower can be represented exactly and uniquely as a linear combination of basis functions $\varphi_n^r(t)$ of the B-spline of order r), and thus the amplitude function $\Omega(t)$ is represented as a linear combination of basis functions $\varphi_n^r(t)$ of a B-spline of order r as $$\Omega(t)=\Sigma_{n=1}^{N_{seg}-(r-1)}A_n\varphi_n^r(t),$$

where $A_n$ ($n=1,2,\ldots,N_{seg}-(r-1)$) are now control parameters associated with the basis functions to be determined such that the first, second, third, and fourth conditions are satisfied.

In some embodiments, the amplitude function $\Omega(t)$ in each time segment is splined using basis functions of the B-spline of order 2 (i.e., r=2). For better accuracy, linear combinations of basis functions of higher order B-spline may be used to spline the amplitude function $\Omega(t)$. The basis functions $\varphi_n^r(t)$ are denoted simply as $\varphi_n(t)$ hereinafter.

As described above, the first condition (also referred to as the phase-space condition) is that the trapped ions that are displaced from their initial positions as the motional modes are excited by the delivery of the amplitude-modulated laser pulse return to the initial positions. A l-th trapped ion in a superposition state $|0\rangle\pm|1\rangle$ is displaced due to the excitation of the p-th motional mode during the gate duration τ and follows the trajectories $\pm\alpha_{l,p}(t')$ in phase space (position and momentum) of the p-th motional mode. The phase space trajectories $\alpha_{l,p}(t')=\int_0^{t'}\Omega(t)\sin(\mu t)e^{i\omega_p t}dt$ are determined by the amplitude function $\Omega(t)$ of the amplitude-modulated laser pulse applied to the l-th trapped ion. Thus, for the chain 102 of N trapped ions, the condition $\alpha_{l,p}(t)=0$ (i.e., the trajectories $\alpha_{l,p}(t)$ are closed) must be imposed for all the P motional modes ($p=1, 2,\ldots, P$). The phase-space condition can be rewritten in terms of the control parameters $A_n$ ($n=1, 2,\ldots, N_{seg}-(r-1)$), as $$\alpha_{l,p}(\tau)=\sum_{n=1}^{N_{seg}-(r-1)} A_n \int_0^\tau \varphi_n(t)\sin(\mu t)e^{i\omega_p t} dt = 0$$

$$\mapsto \sum_{n=1}^{N_A} M_{pn}A_n = 0 (l=i,j,\ p=1,2,\ldots,P),$$

where $M_{pn}$ is defined as $M_{pn}=\int_0^\tau \varphi_n(t)\sin(\mu t)e^{i\omega_p t}dt (p=1,2,\ldots,P, n=1,2,\ldots,N_{seg}-(r-1))$.

Equivalently, the phase-space condition can be written as $M\vec{A}=0$ in a matrix form, where M is a $P\times(N_{seg}-(r-1))$ coefficient matrix of $M_{pn}$ and $\vec{A}$ is a $(N_{seg}-(r-1))$ control parameter vector of $A_n$.

The second condition (also referred to as the stabilization condition) is that an XX-gate operation generated by the amplitude-modulated laser pulse is robust and stabilized against external errors, such as fluctuations in the frequencies 107$_p$ of the motional modes. In the ion trap quantum computer, or system 100, there can be fluctuations in the frequencies $\omega_p$ of the motional modes due to stray electric fields and charge build-up in the ion trap 200 caused by photoionization or temperature fluctuations. Typically over a time span of minutes, the frequencies $\omega_p$ of the motional modes drift with excursion of $\Delta\omega_p/(2\pi)\approx 1$ kHz. The phase-space condition based on the frequencies $\omega_p$ of the motional modes are no longer satisfied when the frequencies of the motional modes have drifted by $\omega_p+\Delta\omega_p$, resulting in a reduction of the fidelity of the XX gate operation. It is known that the infidelity 1−F of an XX gate operation between i-th and j-th trapped ions at zero temperature of the motional-mode phonons, is given by $1-F=\frac{4}{5}\Sigma_p(|\alpha_{i,p}|^2+|\alpha_{j,p}|^2)$. This suggests the XX-gate operation can be stabilized against a drift $\Delta\omega_p$ in the frequencies $\omega_p$ of the motional modes by requiring that the phase space trajectories $\alpha_{l,p}$ (l=i,j) be stationary up to k-th order with respect to variations $\Delta\omega_p$ in $\omega_p$, $$\frac{\partial^k \alpha_{l,p}(\tau)}{\partial \omega_p^k} = \left(\frac{\partial^k}{\partial \omega_p^k}\right)\int_0^\tau \Omega(t)\sin(\mu t)e^{i\omega_p t}dt = 0$$

$$(l = i, j, p = 1, 2, \ldots, P, k = 1, 2, \ldots, K)$$

(referred to as k-th order stabilization condition), where K is a maximal desired degree of stabilization. The amplitude-modulated laser pulse computed by requiring this k-th order stabilization condition can perform an XX gate operation that is resilient against noise (i.e., a drift in the frequencies $\omega_p$ of the motional modes).

The k-th order stabilization condition against fluctuations in the frequencies $\omega_p$ of the motional modes can be rewritten in a matrix form as $$\frac{\partial^k \alpha_{l,p}(\tau)}{\partial \omega_p^k} = \left(\frac{\partial^k}{\partial \omega_p^k}\right)\int_0^\tau \Omega(t)\sin(\mu t)e^{i\omega_p t}dt = \int_0^\tau (it)^k \Omega(t)\sin(\mu t)e^{i\omega_p t}dt = 0$$

$$\mapsto \sum_{n=1}^{N_{seg}-(r-1)} M_{pn}^k A_n = 0 (l = i, j, p = 1, 2, \ldots, P, k = 1, 2, \ldots, K),$$

where $M_{pn}^k$ is defined as $M_{pn}^k = \int_0^\tau (it)^k \varphi_n(t)\sin(\mu t)e^{i\omega_p t}dt (p=1,2, \ldots, P, n=1, 2, \ldots, N_{seg}-(r-1)).$ Equivalently, the k-th order stabilization condition can be written as $M^k\vec{A}=0$ in a matrix form, where $M^k$ is a $P\times(N_{seg}-(r-1))$ coefficient matrix of $M_{pn}^k$.

The phase-space condition and the condition for k-th order stabilization can be written concisely in the form $$\sum_{n=1}^{N_{seg}-(r-1)} M_{pn}^k A_n = 0 (l = 1, 2, \ldots, N, p = 1, 2, \ldots, P, k = 0, 1, \ldots, K),$$

where k=0 corresponds to the phase-space condition. Thus, there are $N_0$ ($=N_{seg}-(r-1)-P(K+1)$) non-trivial (i.e., at least one of the control parameters $A_n$ is non-zero) control parameter vectors (referred to as null-space vectors) $\vec{V}^{(\alpha)}$ ($\alpha=1, 2, \ldots, N_0$) that satisfy the phase-space condition and the stabilization condition ($\Sigma_{n=1}^{N_A} M_{pn}^k A_n = 0$). Once these null-space vectors $\vec{V}^{(\alpha)}$ ($\alpha=1, 2, \ldots, N_0$) are computed, the control parameter vector $\vec{A}$ with elements $A_n$ can be constructed by computing a linear combination ($\Sigma_{\alpha=1}^{N_0} \Lambda_\alpha \vec{V}^{(\alpha)}$) of the null-space vectors $\vec{V}^{(\alpha)}$, in which the coefficients $\Lambda_\alpha$ are now control parameters to be determined such that the remaining conditions, the entangling angle condition and the power-optimal condition, are satisfied. That is, the control parameter $A_n$ can be represented in terms of the coefficients $\Lambda_\alpha$ and the n-th element $v_n^{(\alpha)}$ of the null-space vectors $\vec{V}^{(\alpha)}$ as $A_n = \Sigma_{\alpha=1}^{N_0} \Lambda_\alpha v_n^{(\alpha)}$.

The third condition (also referred to as the entangling angle condition) is that entangling interaction $X_{i,j}(t)$ generated between i-th and j-th trapped ions by the amplitude-modulated laser pulse has a desired value $\theta_{i,j}$ ($0<\theta_{i,j}\leq\pi/8$). The transformations of the combined state of i-th and j-th trapped ions described above correspond to the XX-gate operation with maximal entanglement when $\theta_{i,j}=\pi/8$. In the example described below, the same amplitude-modulated laser pulse is applied to both the i-th and the j-th trapped ions. However, in some embodiments, different amplitude-modulated laser pulses are applied to the i-th and the j-th trapped ions.

The entangling angle condition can be rewritten in terms of the control parameters $A_n$ (n=1, 2, \ldots, $N_{seg}-(r-1)$) as $$\chi_{i,j}(\tau) = \sum_{p=1}^P \eta_{i,p}\eta_{j,p} \int_0^\tau dt \int_0^t dt' \Omega(t)\sin(\mu t)\Omega(t')\sin(\mu t')\sin[\omega_p(t'-t)] = \theta_{i,j},$$

$$\mapsto \sum_{n=1}^{N_{seg}-(r-1)}\sum_{m=1}^{N_{seg}-(r-1)} A_n S_{nm} A_m = \theta_{i,j},$$

where $S_{nm}$ is defined as $$S_{nm} = \sum_{p=1}^P \eta_{i,p}\eta_{j,p} \int_0^\tau dt \int_0^t dt' \varphi_n(t)\sin(\mu t)\sin[\omega_p(t'-t)]\varphi_m(t')\sin(\mu t'),$$

or equivalently, $\vec{A}^T S \vec{A} = \omega_{i,j}$ in a matrix form, where S is a $(N_{seg}-(r-1))\times(N_{seg}-(r-1))$ coefficient matrix of $S_{nm}$ and $\vec{A}^T$ is a transposed vector of $\vec{A}$. This condition can be further rewritten in terms of the coefficients $\Lambda_\alpha$ of the null-space vectors $\vec{V}^{(\alpha)}$ as $$\chi_{i,j}(\tau) = \sum_{\alpha=1}^{N_0}\sum_{\beta=1}^{N_0} \Lambda_\alpha \tilde{S}_{\alpha\beta} \Lambda_\beta = \theta_{i,j},$$

where $\tilde{S}_{\alpha\beta}$ is defined as $\tilde{S}_{\alpha\beta} = \Sigma_{n=1}^{N_{seg}-(r-1)}\Sigma_{m=1}^{N_{seg}-(r-1)} v_n^{(\alpha)} S_{nm} v_m^{(\beta)},$ or equivalently, $\vec{\Lambda}^T \tilde{S} \vec{\Lambda} = \theta_{i,j}$ in a matrix form, where $\tilde{S}$ is a $N_0\times N_0$ coefficient matrix of $\tilde{S}_{\alpha\beta}$, $\vec{\Lambda}$ is a coefficient vector of $\Lambda_\alpha$, and $\vec{\Lambda}^T$ is a transposed vector of $\vec{\Lambda}$.

The fourth condition (also referred to as the power-optimal condition) is that the amplitude-modulated laser pulse is power-optimal, in which the required laser power is minimized. Since the required laser power is inversely proportional to the gate duration τ, the power-optimal amplitude-modulated laser pulses implement an XX gate operation with minimum power requirement if gate duration τ is fixed, or with shortest gate duration τ if a laser power budget is fixed.

The power-optimal condition corresponds to minimizing a power function, $$Q = \int_0^\tau \Omega^2(t) dt$$

that is the square value of the amplitude function $\Omega(t)$ integrated over the gate duration τ. The power function Q can be written in terms of the coefficients $\Lambda_\alpha$ and the n-th element $v_n^{(\alpha)}$ of the null-space vectors $\vec{V}^{(\alpha)}$ as $$Q = \int_0^\tau \left\{ \sum_{\alpha=1}^{N_0} \Lambda_\alpha \sum_{n=1}^{N_{seg}-(r-1)} v_n^{(\alpha)} \varphi_n(t) \right\} \left\{ \sum_{\beta=1}^{N_0} \Lambda_\beta \sum_{m=1}^{N_{seg}-(r-1)} v_m^{(\beta)} \varphi_m(t) \right\} dt =$$

$$\sum_{\alpha=1}^{N_0} \sum_{\beta=1}^{N_0} \Lambda_\alpha \left\{ \sum_{n=1}^{N_{seg}-(r-1)} \sum_{m=1}^{N_{seg}-(r-1)} v_n^{(\alpha)} N_{nm} v_m^{(\beta)} \right\} \Lambda_\beta,$$

where $N_{nm}$ is an overlap matrix defined as $N_{nm} = \int_0^\tau \varphi_n(t) \varphi_m(t) dt$. The overlap matrix $N_{nm}$ has non-zero off-diagonal elements (i.e., the basis functions $\varphi_n(t)$ and $\varphi_m(t)$ (n≠m) are not orthogonal). Thus, to find a power-optimal amplitude-modulated laser pulse, the overlap matrix $N_{nm}$ is transformed to a diagonal matrix to compute the coefficients $\Lambda_\alpha$, that satisfy the power-optimal condition. The power function Q can now be written in a matrix form as $Q = \vec{\Lambda}^T \tilde{N} \vec{\Lambda}$, where the matrix $\tilde{N}$ has elements $$\tilde{N}_{\alpha\beta} = \sum_{n=1}^{N_{seg}-(r-1)} \sum_{m=1}^{N_{seg}-(r-1)} v_n^{(\alpha)} N_{nm} v_m^{(\beta)}.$$

The matrix $\tilde{N}_{\alpha\beta}$ is positive definite, and thus the matrix $\tilde{N}$ has an inverse matrix. Thus, a square root of the matrix $\tilde{N}$ exists. Using a vector $\vec{B}$ defined by the square root of the matrix N (referred to as $$\tilde{N}^{\frac{1}{2}})$$

) and the coefficient vector $$\vec{\Lambda}, \vec{B} = \tilde{N}^{\frac{1}{2}} \vec{\Lambda},$$

the power function Q can be written in terms of the vector $\vec{B}$ as $$Q = \vec{\Lambda}^T \tilde{N} \vec{\Lambda} = \left(\tilde{N}^{-\frac{1}{2}} \vec{B}\right)^T \tilde{N} \left(\tilde{N}^{-\frac{1}{2}} \vec{B}\right) = \vec{B}^T \vec{B},$$

since the matrix $\tilde{N}$ is symmetric (i.e., $\tilde{N}_{\alpha\beta} = \tilde{N}_{\beta\alpha}$).
The entangling angle condition can also be written in terms of the vector $\vec{B}$ as $$\theta_{i,j} = \vec{\Lambda}^T \tilde{S} \vec{\Lambda} = \left(\tilde{N}^{-\frac{1}{2}} \vec{B}\right)^T \tilde{S} \left(\tilde{N}^{-\frac{1}{2}} \vec{B}\right) = \vec{B}^T \left(\tilde{N}^{-\frac{1}{2}} \tilde{S} \tilde{N}^{-\frac{1}{2}}\right) \vec{B},$$

where $$\tilde{N}^{-\frac{1}{2}} \tilde{S} \tilde{N}^{-\frac{1}{2}}$$

is a symmetric matrix. Thus, an eigenvector $\vec{B}^{(optimal)}$ of the matrix $$\tilde{N}^{-\frac{1}{2}} \tilde{S} \tilde{N}^{-\frac{1}{2}}$$

having the largest eigenvalue corresponds to the power-optimal pulse.

Once the eigenvector $\vec{B}^{(optimal)}$ is computed, the amplitude function of the power-optimal pulse can be computed as $$\vec{\Omega}^{(optimal)} = \sum_{n=1}^{N_{seg}-(r-1)} A_n^{(optimal)} \varphi_n(t) = \sum_{\alpha=1}^{N_0} \Lambda_\alpha^{(optimal)} \sum_{n=1}^{N_{seg}-(r-1)} v_n^{(\alpha)} \varphi_n(t),$$

where $\Lambda_\alpha^{(optimal)} = \tilde{N}^{-\frac{1}{2}} \vec{B}^{(optimal)}$, and $A_n^{(optimal)} = \sum_{\alpha=1}^{N_0} \Lambda_\alpha^{(optimal)} v_n^{(\alpha)}$.

Thus, the amplitude function $\Omega(t)$ of a pulse can be computed based on the control parameters $A_n$ (n=1, 2, . . . , $N_{seg}$−(r−1)) or equivalently the control parameter vector $\vec{A}$, that satisfy the phase-space condition, the stabilization condition, the entangling angle condition, and the power-optimal condition. It should be noted that these conditions are in linear algebraic forms in terms of the control parameter vector $\vec{A}$. Thus, the control parameters $A_n$ that satisfy these conditions can be computed by known linear algebraic computational methods without approximation or iterations. Once the control parameters $A_n$ are computed, the amplitude function $\Omega(t)$ can be computed.

EXAMPLE

Figure 7A:
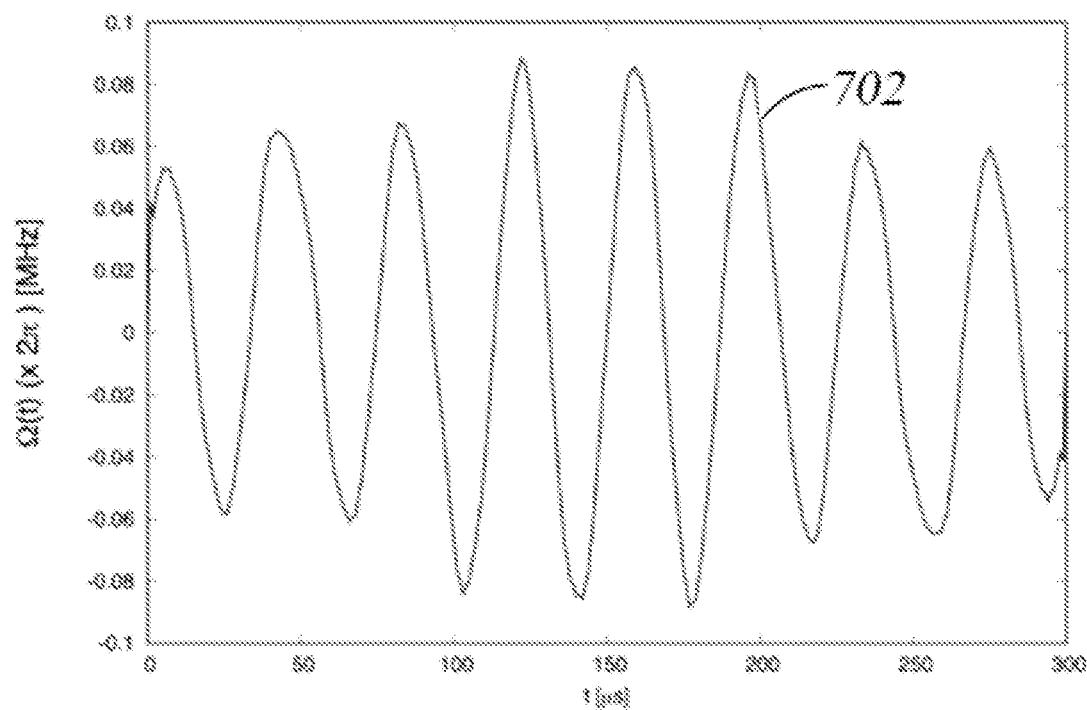
FIGS. 7A, 7B, and 7C illustrate a pulse function of an amplitude-modulated laser pulse, an analytically computed amplitude function of the amplitude-modulated laser pulse, and a spline interpolation of the analytically computed amplitude function according to one embodiment.
Figure 7B:
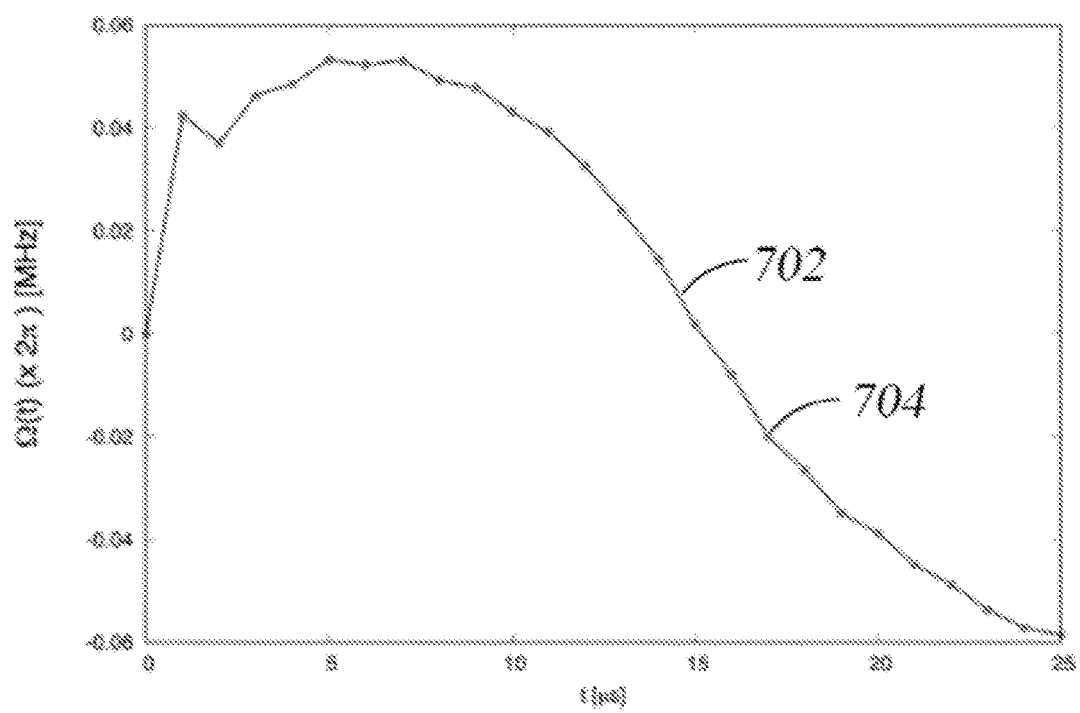
Figure 7C:
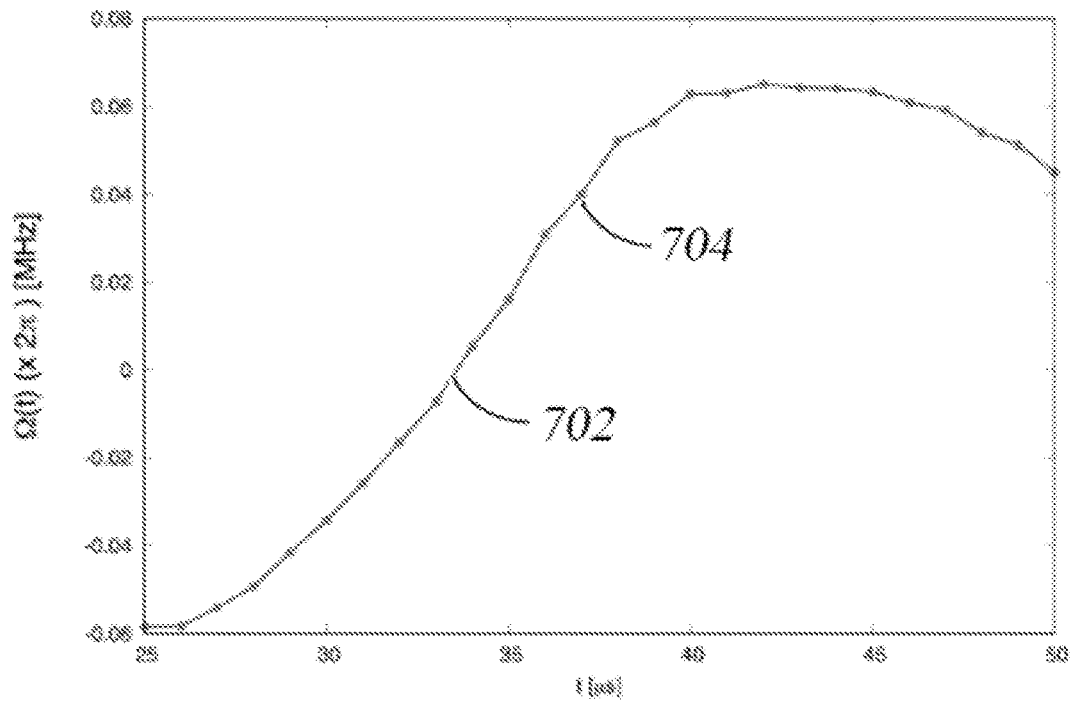

In the following, an example pulse that is delivered to a pair of trapped ions that are disposed in a system, as described above, is described below. In the example, the chain 102 includes 15 trapped ions of which the middle 13 trapped ions are used as qubits. FIGS. 7A, 7B, and 7C illustrate a computed amplitude function $\Omega(t)$ 702 of the example pulse, in time ranges between 0 μs to 300 μs, 0 μs and 25 μs, and 25 μs and 50 μs, respectively. Start and end points of each time segment for splining are indicated by the dots 704 in FIGS. 7B and 7C. The example pulse is a power-optimal pulse computed for a gate duration τ=300 μs The stabilization condition includes K-th order stabilization (K=0) with respect to a drift $\Delta\omega_p$ in the frequencies $\omega_p$ of the motional modes. The duration of a time segment in the splining is lower-bounded by the speed- and bandwidth-limited real hardware, such as limited communication channel capacity and limited amplitude modulation rate. The gate duration τ is divided into 300 equally spaced segments (i.e., $N_{seg}$=300). The detuning frequency is constant at 2.7590

MHz. A B-spline of order 2 (i.e., r=2) is used in the pulse computation and the spline interpolation.

Figure 8:
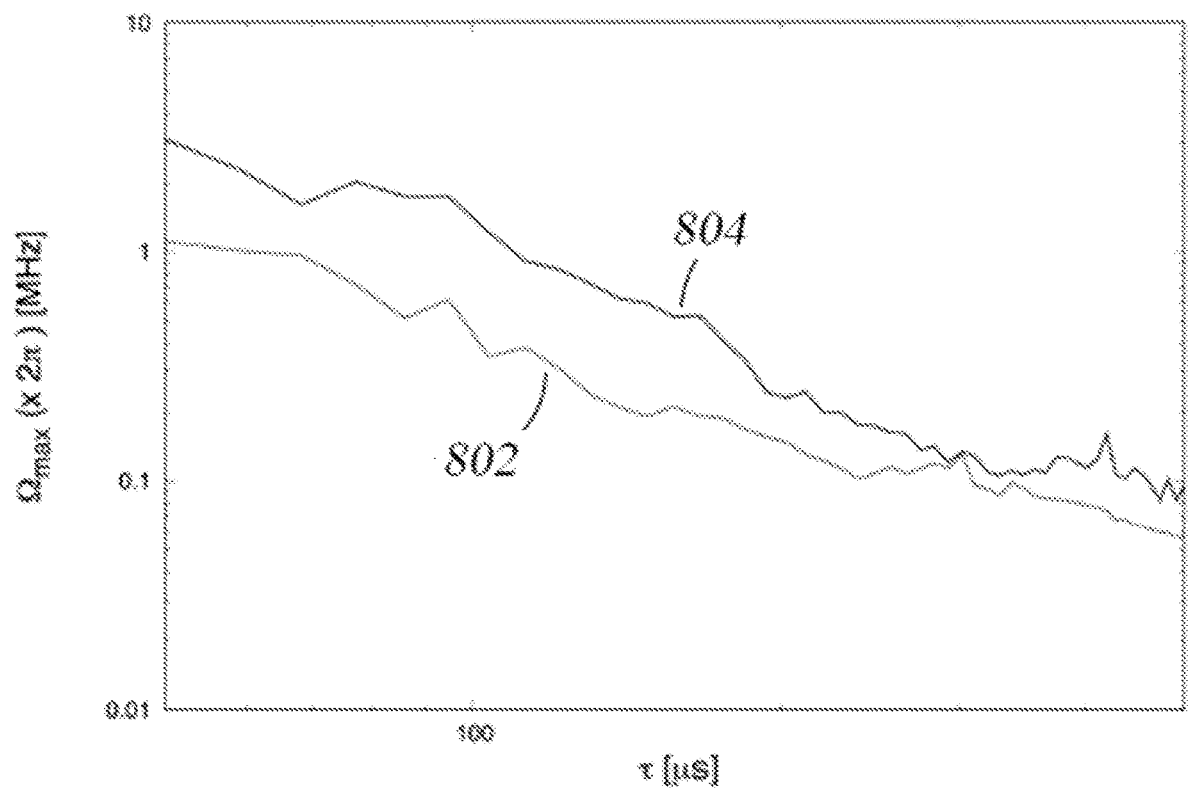
FIG. 8 illustrates comparison of peak power of an amplitude-modulated laser pulse shown in FIGS. 7A, 7B, and 7C with peak power of an amplitude-and-frequency modulated laser pulse computed by a conventional pulse designing method.

FIG. 8 illustrates comparison of peak power 804 of the example pulse shown in FIGS. 7A, 7B, and 7C with peak power 802 of an amplitude-and-frequency modulated pulse computed by a conventional pulse designing method. The amplitude-modulated pulse 702 in FIGS. 7A, 7B, and 7C computed based on B-spline with order r=2 requires more peak power than the amplitude-and-frequency modulated pulse. However, it should be noted the amplitude-modulated pulse 702 in FIGS. 7A, 7B, and 7C is continuous as required. This results in better gate fidelity in practice since there is no power jump required between different segments, as is typically the case with the conventional amplitude modulated gates. With a higher order r, the computed pulse can be made smooth, further increasing the fidelity in practice.

As described above, in configuring an amplitude-modulated laser pulse to perform an entangling gate operation between two qubits, the amplitude function of the amplitude-modulated laser pulse is determined such that the phase-space condition, the stabilization condition, the entangling angle condition, and the power-optimal condition are satisfied. The methods described above are able to configure an amplitude-modulated laser pulse whose time variation is within the speed and bandwidth limitations of real hardware used in the quantum computing system so that an actual laser pulse can be applied to the trapped ions of the quantum computing system to perform an entangling gate operation. Therefore, an amplitude-modulated laser pulse to perform an entangling gate operation may be implemented in a real physical system accurately as designed, without causing infidelity in an intended computation process.

Additionally, determining the control parameters includes solving a set of linear equations. Furthermore, an amplitude and a detuning frequency function of a pulse can be analytically computed from the determined control parameters. Thus, determining the control parameters and subsequently constructing a pulse can be performed in an efficient manner to perform a desired XX-gate operation. The XX-gate operations are performed for other pairs of ions using different pulses to run a desired quantum algorithm on a quantum register. At the end of running the desired quantum algorithm, the population of the qubit states (trapped ions) within the quantum register is measured (read-out), so that the results of the quantum computation(s) with the desired quantum algorithm can be determined and provided to the classical computer for use to obtain solutions to the problems that may be intractable by the classical computer.

While the foregoing is directed to specific embodiments, other and further embodiments may be devised without departing from the basic scope thereof, and the scope thereof is determined by the claims that follow.

The invention claimed is:

1. A method of performing an entangling gate operation using a quantum computer system, comprising:
    configuring, by a classical computer, an amplitude function of an amplitude-modulated laser pulse over a plurality of time segments to cause entangling interaction between a pair of trapped ions of a plurality of trapped ions, each of the plurality of trapped ions having two frequency-separated states defining a qubit, wherein the amplitude function in each time segment is splined using a set of basis functions and associated control parameters; and
    performing an entangling gate operation between the pair of trapped ions by applying, by a system controller, an amplitude-modulated laser pulse having the configured amplitude function to the pair of trapped ions.

2. The method according to claim 1, wherein the performing of the entangling gate operation comprises modulating the laser pulse based on instructions provided from the classical computer.

3. The method according to claim 1, wherein the set of basis functions comprises basis functions of a B-spline.

4. The method according to claim 1, wherein the configuring of the amplitude function of the amplitude-modulated laser pulse comprises computing the associated control parameters based on a phase-space condition and an entangling angle condition.

5. The method according to claim 4, wherein the computing of the associated control parameters is further based on a stabilization condition or a power-optimal condition.

6. The method according to claim 1, wherein the system controller comprises an acousto-optic modulator, which is configured to selectively act on each of the ions of the pair of trapped ions.

7. A non-volatile computer-readable medium including computer program instructions, which when executed by a processor, cause the processor to:
    configure an amplitude function of an amplitude-modulated laser pulse over a plurality of time segments to cause entangling interaction between a pair of trapped ions of a plurality of trapped ions, each of the plurality of trapped ions having two frequency-separated states defining a qubit, wherein the amplitude function in each time segment is splined using a set of basis functions and associated control parameters; and
    perform an entangling gate operation between the pair of trapped ions by applying an amplitude-modulated laser pulse having the configured amplitude function to the pair of trapped ions.

8. The non-volatile computer-readable medium according to claim 7, wherein the performing of the entangling gate operation comprises modulating the laser pulse, by a system controller, based on instructions provided from a classical computer.

9. The non-volatile computer-readable medium according to claim 7, wherein the set of basis functions comprises basis functions of a B-spline.

10. The non-volatile computer-readable medium according to claim 7, wherein the configuring of the amplitude function of the amplitude-modulated laser pulse comprises computing the associated control parameters based on a phase-space condition and an entangling angle condition.

11. The non-volatile computer-readable medium according to claim 10, wherein the computing of the associated control parameters is further based on a condition of stabilization or a power-optimal condition.

12. A quantum computing system, comprising:
    a plurality of trapped ions, each of the trapped ions having two hyperfine states defining a qubit; and
    a classical computer comprising non-volatile memory having a number of instructions stored therein which, when executed by a processor, causes the quantum computing system to perform operations comprising:
        configuring an amplitude function of an amplitude-modulated laser pulse over a plurality of time segments to cause entangling interaction between a pair of trapped ions of a plurality of trapped ions, each of the plurality of trapped ions having two frequency-separated states defining a qubit, wherein the amplitude function in each time segment is splined using a set of basis functions and associated control parameters; and performing an entangling gate operation between the pair of trapped ions by applying, by a system controller, an amplitude-modulated laser pulse having the configured amplitude function to the pair of trapped ions.

13. The quantum computing system according to claim 12, wherein the performing of the entangling gate operation comprises modulating the laser pulse based on instructions provided from the classical computer.

14. The quantum computing system according to claim 12, wherein
each of the trapped ions is an ion having a nuclear spin and an electron spin such that a difference between the nuclear spin and the electron spin is zero.

15. The quantum computing system according to claim 14, wherein
each of the trapped ions is an ion having a nuclear spin ½ and the $^2S_{1/2}$ hyperfine states.

16. The quantum computing system according to claim 15, wherein the ion is $^{171}Yb^+$.

17. The quantum computing system according to claim 15, wherein the ion is $^{133}Ba^+$.

18. The quantum computing system according to claim 12, wherein the set of basis functions comprises basis functions of a B-spline.

19. The quantum computing system according to claim 12, the configuring of the amplitude function of the amplitude-modulated laser pulse comprises computing the associated control parameters based on a phase-space condition and an entangling angle condition.

20. The quantum computing system according to claim 19, wherein the computing of the associated control parameters is further based on a stabilization condition or a power-optimal condition.

21. The quantum computing system according to claim 12, further comprising:
an acousto-optic modulator, which is configured to selectively deliver the amplitude-modulated laser pulse to each of the plurality of trapped ions; and
a field-programmable gate array (FPGA) that is configured to receive instructions from the classical computer and transfer control signals, which is derived from the instructions received from the classical computer, to the acousto-optic modulator, wherein the transferred control signals provide information that enables the acousto-optic modulator to selectively deliver the amplitude-modulated laser pulse to each of the plurality of trapped ions.

* * * * *